United States Patent [19]
Shields et al.

[11] Patent Number: 6,153,504
[45] Date of Patent: Nov. 28, 2000

[54] METHOD OF USING A SILICON OXYNITRIDE ARC FOR FINAL METAL LAYER

[75] Inventors: Jeffrey A. Shields, Sunnyvale; Bharath Rangarajan, Santa Clara, both of Calif.

[73] Assignee: Advanced Micro Devices, Inc., Sunnyvale, Calif.

[21] Appl. No.: 09/375,004

[22] Filed: Aug. 16, 1999

[51] Int. Cl.[7] .................................................. H01L 21/28
[52] U.S. Cl. ............................................ 438/613; 438/952
[58] Field of Search ......................... 438/613, FOR 405, 438/952

[56] References Cited

U.S. PATENT DOCUMENTS 5,707,487  1/1998  Hori et al. .
5,837,576  11/1998  Chen et al. .
5,918,147  6/1999  Filipiak et al. .
5,976,973  11/1999  Ohira et al. .

OTHER PUBLICATIONS

"Formation Mechanism of Ring Defects During Metal Rie", by Colgan et al., 1994 VMIC Conference, Jun. 7–8; pp. 284–286.

*Primary Examiner*—George Fourson
*Assistant Examiner*—Joannie A. Garcia

[57] ABSTRACT

A SiON ARC is formed on the uppermost metal or bonding pad layer, a topside protective layer, e.g., oxide, nitride or oxynitride, formed thereon and etching is conducted through the topside protective layer and SiON ARC to form a bonding pad opening. The use of SiON as an ARC reduces bonding pad etching time, enables a reduction in the height of the metal stack for reduced capacitance between metal lines and increased circuit speed, and improves etch marginality due to the reduced aspect ratio.

13 Claims, 2 Drawing Sheets

METHOD OF USING A SILICON OXYNITRIDE ARC FOR FINAL METAL LAYER

RELATED APPLICATIONS

This application contains subject matter similar to subject matter disclosed in U.S. patent application Ser. No. 09/371,920 filed on Aug. 11, 1999. The entire disclosure of U.S. patent application Ser. No. 09/371,920 filed on Aug. 11, 1999 is hereby incorporated by reference herein.

TECHNICAL FIELD

The present invention relates to a method of manufacturing a semiconductor device having sub-micron features. The present invention has particular applicability in manufacturing semiconductor devices with a design rule of about 0.18 micron and under with accurately dimensioned conductive features.

BACKGROUND ART

The escalating requirements for high density and performance associated with ultra-large scale integration require responsive changes in electrical interconnect patterns, which is considered one of the most demanding aspects of ultra-large scale integration technology. Demands for ultra-large scale integration semiconductor wiring require increasingly denser arrays with minimal spacing between conductive lines. Implementation becomes problematic in manufacturing semiconductor devices having a design rule of about 0.18 micron and under, e.g., about 0.15 micron and under.

Semiconductor devices typically comprise a substrate and elements, such as transistors and/or memory cells, thereon. Various interconnection layers are formed on the semiconductor substrate to electrically connect these elements to each other and to external circuits. The formation of interconnection layers is partly accomplished utilizing conventional photolithographic techniques to form a photoresist mask comprising a pattern and transferring the pattern to an underlying layer or composite by etching the exposed underlying regions.

In accordance with conventional practices, interconnect structures comprise electrically conductive layers such as aluminum (Al), copper (Cu) or alloys thereof. In patterning the interconnect structure, an anti-reflective coating (ARC) is typically provided between the photoresist and the conductive layer to avoid deleterious reflections from the underlying conductive layer during patterning of the photoresist. For example, the ARC can reduce the reflectivity of an Al metal layer to 25–30% from a reflectivity of about 80–90%. ARCs are chosen for their optical properties and compatibility with the underlying conductive layer. Ihowever, many of the desirable ARCs, such as titanium nitride (TiN) contain basic components, such as nitrogen, which adversely interact with the photoresist material thereon during photolithographic processing, particularly in conventional deep-ultraviolet (deep-UV) resist processing, e.g., deep-UV radiation having a wavelength of about 100 nm to about 300 nm.

A conventional interconnect structure is illustrated in FIG. 1 and comprises substrate 8 with dielectric layer 10 thereon. A conductive layer 12 is formed on dielectric layer 10 and ARC 14 is formed on conductive layer 12. A photoresist layer 16, is formed on ARC 14. In very large scale integrated circuit applications, dielectric 10 has several thousand openings which can be either vias or lateral metallization lines where the metallization pattern serves to interconnect structures on or in the semiconductor substrate. Dielectric layer 10 can comprise inorganic layers such as silicon dioxide, silicon nitride, silicon oxynitride, etc. or organic layers such as polyimide or combinations of both. Conductive layer 12 typically comprises a metal layer such as Al, Cu, or alloys thereof. ARC 14 typically comprises a nitride of silicon or a nitride of a metal such as titanium, e.g., titanium nitride (TiN).

To achieve high density line wiring, photoresist coating 16 is typically a deep UV radiation sensitive pliotoresist capable of achieving line width resolutions of about 0.15 micron. During photolithographic processing, radiation is passed through mask 18 defining a desired conductive pattern to imagewise expose photoresist coating 16. After exposure to radiation, the photoresist layer is developed to form a relief pattern therein. It has been observed, however, that a residue remains at the photoresist interface and ARC, near the developed photoresist sidewall, resulting in a parabolic appearance, 22a and 22b, at the base of the photoresist known as "footing", as shown in FIG. 2 wherein elements similar to those in FIG. 1 are denoted by similar reference numerals. In FIG. 2, reference numeral 20 denotes the pliotoresist mask. The footing problem is typical of conventional photolithographic techniques employing a photoresist coating over an ARC in forming interconnections. Footing of the photoresist during patterning results in a loss of critical dimensional control in the subsequently patterned underlying conductive layer limiting the ability to resolve small spaces between conductive lines and thus limiting wiring density.

The conventional approach to the footing problem illustrated in FIG. 2 comprises the formation of a hard mask, such as silicon oxide derived from tetraethyl orthsilicate (TEOS), on the TiN ARC layer to prevent interaction of a basic component, e.g., nitrogen, in the ARC with the deep UV photoresist mask. The metal stack, however, is quite high and presents an unfavorable aspect ratio leading to an undesirably high capacitance between the metal lines and a poor etch margin. For example, a conventional metal stack comprises a lower barrier metal layer of titanium (Ti), TiN, titanium tungsten or titanium tin at a thickness of about 250 Å to about 750 Å. Al or an Al alloy deposited thereon typically has a thickness of about 4,000 Å to about 8,000 Å. The typical TiN or Ti/TiN ARC layer has a thickness of about 750 Å to about 1,150 Å, while the hard mask typically has a thickness of at least 300 Å. Thus, the typical combined thickness of the hard mask and ARC layer is about 1,500 Å.

Another problem attendant upon the use of a TiN as an ARC occurs in the final or uppermost metal layer, typically referred to as the bonding pad layer. The TiN ARC typically employed for the final metal layer is very difficult to remove when etching through the overlying topside protective layer to expose the Al or Al alloy surface for forming a bonding pad opening in which a bonding pad and wiring are provided for external electrical connection. For example, the TiN ARC must be separately etched from the overlying topside protective coating, which is typically an oxide, nitride or oxynitride deposited at a thickness of about 10,000 Å to about 50,000 Å. The topside protective coating typically has an etch rate of about 5,000 Å to about 10,000 Å/minute; whereas, the etch rate of the TiN ARC is less than about 1,000 Å/minute requiring no less than about 120 seconds for etching through the TiN ARC. This etching difficulty attendant upon the use of a TiN ARC for the final metal layer is aggravated by the need to increase the thickness of the TiN ARC as geometries are reduced in order to reduce its sensitivity to bridging caused by developer penetration of the TiN ARC during masking. The penetration of a TiN ARC by developer is a known problem. See E. G. Colgan, et seq. "Formation Mechanism Of Ring Defects During Metal RIE", Jun. 7–8, 1994, VMIC CONFERENCE 1994 ISMIC-103/94/0284, pages 284–286. The problems attendant upon the use of a TiN ARC for the final metal layer also occur with the use of a Ti or Ti/TiN ARC.

In copending U.S. application Ser. No. 09/163,601 filed on Sep. 30, 1998, it was reported that certain oxide films themselves contain nitrogen or other components which adversely interact with deep UV photoresist materials as, for example, nitrogen or nitrogen products stemming from the use of silane and nitrite oxide. The invention disclosed in copending U.S. application Ser. No. 09/163,601 comprises depositing an oxide layer on a TiN ARC by plasma enhanced chemical vapor deposition (PECVD) from an organo silicon compound, such as an alkoxysilane, e.g., TEOS, or by high density plasma (HDP) oxide deposition of a silicon oxide film. Such oxide films are free of adverse interactions with a photoresist coating thereon. In U.S. Pat. No. 5,837,576 a silicon oxide nitride etching stop layer is employed to pattern a storage node of a capacitor.

In copending U.S. patent application Ser. No. 09/371,920 filed on Aug. 11, 1999, a method is disclosed comprising the use of a SiON ARC which also serves as a hard mask. The use of SION as a combined ARC/hard mask enables a reduction in the height of the metal stack, thereby reducing capacitance between metal lines and increasing circuit speed, in addition to improving etch marginality due to the reduced aspect ratio. The disclosed embodiments include forming a thin silicon oxide layer on the SiON ARC/hard mask before depositing a deep UV photoresist layer to minimize footing.

There exists a need for methodology enabling formation of a bonding pad opening with greater efficiency, reduced interwiring capacitance and improved etch marginality. There exists a particular need for such methodology in manufacturing semiconductor devices having a design rule of about 0.18 micron and under, e.g., about 0.15 micron and under.

SUMMARY OF THE INVENTION

An advantage of the present invention is a method of manufacturing a multi-metal layer semiconductor device with greater efficiency.

Another advantage of the present invention is a method of etching a bonding pad opening with higher speed and improved etch marginality.

Additional advantages and features of the present invention will be set forth in part in the description which follows and in part will become apparent to those having ordinary skill in the art upon examination of the following or may be learned from the practice of the invention. The advantages of the present invention may be realized and obtained as particularly pointed out in the appended claims.

According to the present invention, the foregoing and other advantages are achieved in part by a method of manufacturing a multi-metal layer semiconductor device, the method comprising forming an uppermost metal layer over a substrate; forming a silicon oxynitride layer on the uppermost metal layer; forming a photoresist pattern on the silicon oxynitride layer; patterning the uppermost metal layer by etching to form a plurality of uppermost metal features, wherein the silicon oxynitride layer serves as an anti-reflective coating and a hard mask; depositing a topside protective dielectric layer on the patterned uppermost metal layer; and etching through the topside protective dielectric layer and silicon oxynitride layer to form a bonding pad opening to an uppermost metal feature for external electrical connection.

Embodiments of the present invention comprise utilizing a silicon oxynitride (SiON) layer as a combined ARC and hard mask having a thickness of about 300 Å to about 1,000 Å, e.g., about 500 Å to about 750 Å. Embodiments of the present invention further comprise reducing photoresist footing by forming a thin silicon oxide layer, having a thickness of about 20 Å to about 300 Å, on the SiON ARC/hard mask, as by PECVD deposition from TEOS or by depositing a HDP oxide.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the invention is capable of other and different embodiments, and its several details are capable of modifications in various obvious respects, all without departing from the present invention. Accordingly, the drawing and description are to be regarded as illustrative in nature, and not as restrictive.

DESCRIPTION OF THE INVENTION

Figure 1:
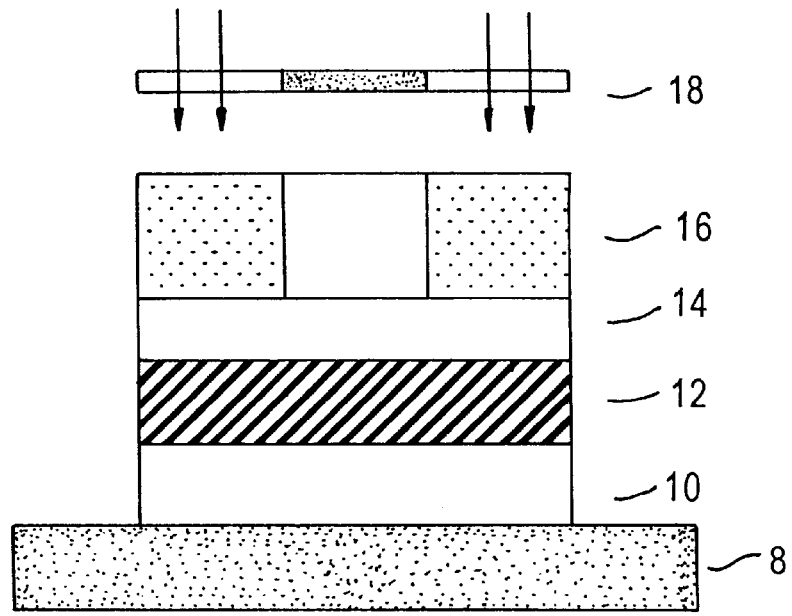
FIG. 1 schematically depicts a conventional interconnect structure prior to radiation exposure.
Figure 2:
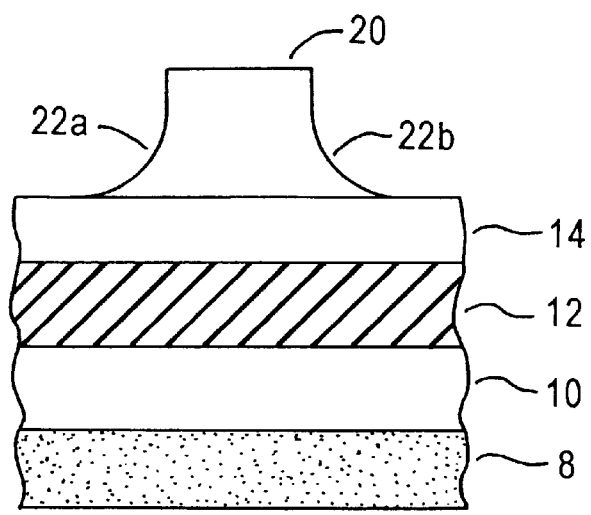
FIG. 2 schematically illustrates a conventional interconnect structure having a patterned photoresist line.

The present invention stems from the discovery that a relatively thin SiON layer, such as about 300 Å to about 1,000 Å, e.g., about 500 Å to about 750 Å, can advantageously and effectively replace both a conventional hard mask, typically Ti, TiN, or Ti/TiN ARC, and an oxide hard mask which typically has a combined total of about 1,500 Å. The reduction in the height of the metal stack advantageously reduces the capacitance between the metal lines which, in turn, leads to higher circuit speed. In addition, the reduction of the metal stack thickness improves metal etch marginality by virtue of reducing the aspect ratio. A further advantage of the present invention is that the SiON is deposited at a thickness greater than that at which a separate oxide hard mask would be employed and still produces a thinner gate stack thereby increasing the benefit of the hard mask. As a result, the resist can be reduced in thickness, e.g., down to about 7,000 Å to about 9,000 Å, thereby improving photolithographic capability as well.

Advantageously, the use of a SiON ARC/hard mask performs the traditional functions of an ARC for photolithographic needs as well as serving as an etch stop layer. In addition, the use of an SiON ARC/hard mask prevents attack of the metal lines for very thin resist layers. Embodiments of the present invention comprise further improvements in footing by treating the surface of the deposited SiON layer to form a thin oxide coating thereon, e.g., an oxide coating having a thickness of about 20 Å to about 300 Å. This can be accomplished by treating the SiON surface with a plasma containing $O_2/N_2$ or $N_2O$ to generate a thin oxide layer of 20 to 50 Å thickness. The $N_2O$ plasma can efficiently be conducted in-situ after the SiON deposition. Alternately, a thin layer of silicon oxide layer can be deposited by PECVD employing TEOS or by HDP oxide deposition.

The use of a SiON ARC/hard mask for the final metal layer offers particular advantages by improving the efficiency of simplifying etching the bonding pad opening and reducing the amount and time required to etch the bonding pad opening. The SiON ARC/hard mask is resistant to chemical penetration, as by developer, thereby avoiding subsequent bridging defects during the metal etch. The SiON ARC/hard mask enables reduction of the thickness of the resist, thereby providing enhanced etch process marginality. On the other hand, the SiON ARC/hard mask can be increased in thickness without adverse consequences. Advantageously, the SiON ARC/hard mask can be removed to expose the aluminum when etching to form the bonding pad opening at an etch rate of about 4 to about 10 times greater than that of TiN. In addition, by replacing conducive TiN with dielectric SiON, the capacitance between the adjacent metal line is advantageously reduced by reducing the total height of the conductive.

In accordance with embodiments of the present invention, a multi-metal layer semiconductor device is formed and the final metal layer is provided with a SiON ARC/hard mask. Patterning is then conducted, as by using a deep UV resist and etching, thereby obtaining the advantages disclosed in copending U.S. patent application Ser. No. 09/371,920. The upper metal layer can comprise a barrier layer, such as Ti, TiN or Ti/TiN, and a primary Al or Al alloy layer thereon. Optionally, a thin oxide layer is formed on the SiON ARC/hard mask to achieve further improvements in footing. After etching to pattern the final metal layer into a plurality of metal features, the topside protective layer is deposited. The topside protective layer, can comprise any of various dielectric materials conventionally employed for that purpose, such as an oxide, nitride, oxynitride, e.g., a silicon nitride, a silicon oxide derived from tetraethyl orthsilicate (TEOS) or silane, or a silicon oxynitride. Other suitable topside protective materials include organic dielectric materials such as polyimides as well as a boro phospho silicate glass (BPSG). Etching is then conducted, e.g., anisotropic etching, employing conventional fluorine chemistry, e.g., $CF_4$, $CHF_3$ or $SF_6$, in addition to argon, oxygen, nitrogen and/or helium. Advantageously, the etching rate for etching through the topside protective layer, which typically ahs a thickness of about 10,000 Å to about 50,000 Å, and the SiON ARC/hard mask is about 5,000 Å to about 10,000 Å/minute, thereby enabling etching of the bonding pad opening for no longer than about 170 seconds.

Figure 3A:
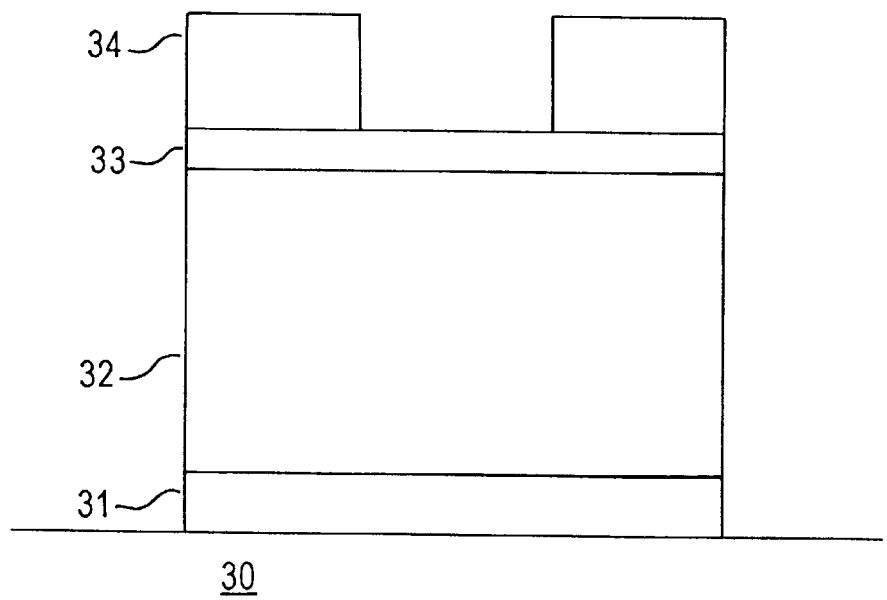
FIGS. 3A and 3B schematically illustrate an embodiment of the present invention.
Figure 3B:
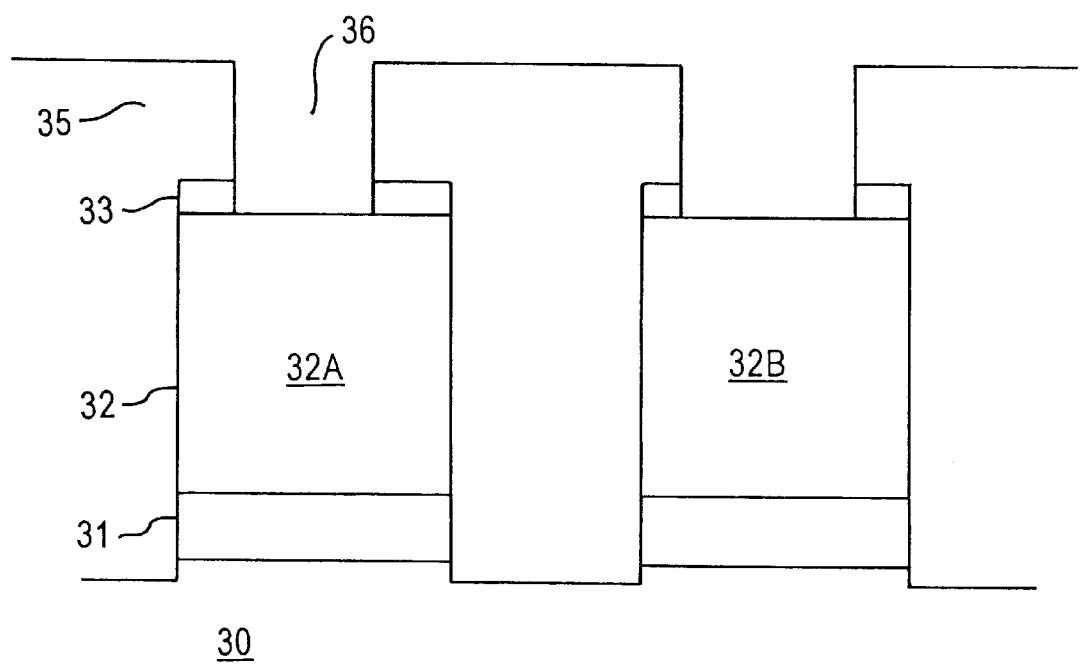

An embodiment of the present invention is schematically illustrated in FIGS. 3A and 3B, wherein similar features are denoted by similar reference numerals. Adverting to FIG. 3A, reference numeral 30 denotes an interdielectric layer, e.g., a silicon oxide. A conventional conductive layer is fonned over interdielectric layer 30 and comprises a first barrier metal layer 31, such as Ti, TIN, TiW or Ti/TiN, at a thickness of about 250 Å to about 750 Å, and an Al or Al alloy layer 32 thereon at a thickness of about 4,00 Å to about 8,000 Å. A SION ARC/hard mask 33 is deposited on the upper surface of layer 32 at a thickness of about 300 Å to about 1,000 Å, e.g., about 500 Å to about 750 Å. SION ARC/hard mask can be deposited in a conventional manner, such as PECVD employing monosilane, nitrous oxide ($N_2O$) and ammonia. The reactants are adjusted consistent with conventional practices to optimize the refractive index of the deposited SION layer to function effectively as an ARC. The photoresist mask 34 is formed on the SiON ARC/hard mask 33. The surface of the SION ARC/hard mask is advantageously modified by providing a thin oxide layer (not shown) for improved resistance to footing, e.g., at a thickness of about 20 Å to about 300 Å, without significantly increasing the height of the stack. Advantageously, since SION layer 33 also serves as a hard mask, the thickness of the photoresist mask 34 can be reduced to about 7,000 Å to about 9,000 Å. The silicon oxide layer can be formed by the methodology disclosed in copending application Ser. No. 09/163,601 filed on Sep. 30, 1998, the entire disclosure of which is hereby incorporated by reference herein.

Anisotropic etching is then conducted to form a plurality of uppermost metal features 32A, 32B and a topside protective layer 35 deposited, e.g., a silicon nitride, silicon oxide or silicon oxynitride. Etching is then conducted to form a bonding pad opening 36 exposing the upper surface of an uppermost metal feature, e.g., 32A. The bonding pad opening 16 is then provided with a bonding pad and wiring (not shown) for external electrical connection in a conventional manner.

Advantageously, the use of a SiON ARC/hard mask 33, achieves the advantages disclosed in copending U.S. patent application Ser. No. 09/371,920 to increasing the speed of etching and avoiding the metal bridging problem caused by developer penetration of a conventional TiN ARC during metal masking.

The present invention enjoys industrial utility in manufacturing any of various types of semiconductor devices, particularly semiconductor devices having features in the deep sub-micron range, such as about 0.18 micron and under, e.g., about 0.15 micron and under. The present invention advantageously enables manufacturing semiconductor devices employing deep UV photoresist technology without encountering significant footing and with reduced interwiring capacitance, thereby increasing circuit speed. In addition, the methodology of the present invention enjoys superior etch marginality due to a reduced aspect ratio stemming from reducing the metal stack for patterning, enables the use of a thinner resist thereby enhancing photolithographic flexibility, increases bonding pad etching efficiency and avoids metal bridging due to developer penetration.

Only the preferred embodiment of the present invention and an example of its versatility is shown and described in the present disclosure. It is to be understood that the present invention is capable of use in various other combinations and environments and is capable of changes or modifications within the scope of the inventive concept as expressed herein.

What is claimed is:

1. A method of manufacturing a multi-metal layer semiconductor device, the method comprising:

forming an uppermost metal layer over a substrate;

forming a silicon oxynitride layer on the uppermost metal layer;

forming a photoresist pattern on the silicon oxynitride layer;

patterning the uppermost metal layer by etching to form a plurality of uppermost metal features, wherein the silicon oxynitride layer serves as an anti-reflective coating and a hard mask;

depositing a topside protective dielectric layer on the patterned uppermost metal layer;

etching through the topside protective dielectric layer and silicon oxynitride layer to form a bonding pad opening to an uppermost metal feature for external electrical connection; and forming a bonding pad and external electrical connection in the bonding pad opening;

wherein the silicon oxynitride layer functions as both an antireflective coating and an etch stop layer in the patterning the uppermost metal layer step.

2. The method according to claim 1, further comprising forming an oxide layer on the silicon oxynitride layer.

3. The method according to claim 2, comprising forming a silicon oxide layer as the oxide layer.

4. The method according to claim 3, comprising forming the silicon oxynitride layer at a thickness of about 300 Å to about 1,000 Å.

5. The method according to claim 4, comprising forming the silicon oxynitride layer at a thickness of about 500 Å to about 750 Å.

6. The method according to claim 3, comprising forming the silicon oxide layer at a thickness of about 20 Å to about 300 Å.

7. The method according to claim 3, comprising depositing an oxide, nitride or oxynitride layer as the topside protective layer.

8. The method according to claim 7, comprising depositing a silicon oxide, silicon nitride or silicon oxynitride layer as the topside protective layer.

9. The method according to claim 1, comprising etching to form the bonding pad opening in a single etching step.

10. The method according to claim 9, comprising etching to form the bonding pad opening at a rate of about 5000 Å, minute to about 10,000 Å/minute.

11. The method according to claim 1, comprising etching to form the bonding pad opening for no longer than about 170 seconds.

12. The method according to claim 1, further comprising forming a barrier layer and forming the metal layer on the barrier layer.

13. The method according to claim 1, wherein the photoresist pattern comprises a deep UV photoresist material.

* * * * *